United States Patent
Velasquez et al.

(10) Patent No.: US 7,104,434 B2
(45) Date of Patent: Sep. 12, 2006

(54) SCREEN PRINTING SQUEEGEE FOR APPLYING SOLDER PASTE

(75) Inventors: Eric P. Velasquez, Pangasinan (PH); Jason Ronnie P. Ribunal, Baguio (PH)

(73) Assignee: Texas Instruments Incorporated, Dallas, TX (US)

(*) Notice: Subject to any disclaimer, the term of this patent is extended or adjusted under 35 U.S.C. 154(b) by 220 days.

(21) Appl. No.: 10/795,862

(22) Filed: Mar. 9, 2004

(65) Prior Publication Data

US 2004/0169060 A1    Sep. 2, 2004

Related U.S. Application Data

(62) Division of application No. 10/243,473, filed on Sep. 13, 2002, now abandoned.

(51) Int. Cl.
*B23K 1/00*    (2006.01)
(52) U.S. Cl. .................. 228/22; 101/127; 101/169; 15/245.1; 15/236.01
(58) Field of Classification Search ............... 228/22
See application file for complete search history.

(56) References Cited

U.S. PATENT DOCUMENTS

| | | | |
|---|---|---|---|
| 5,044,306 A | 9/1991 | Erdmann | 118/120 |
| 5,047,262 A * | 9/1991 | deVries et al. | 427/508 |
| 5,152,219 A | 10/1992 | Adachi et al. | 101/123 |
| 5,722,321 A | 3/1998 | Szyszko et al. | 101/123 |
| 5,826,516 A | 10/1998 | Shimazu et al. | 101/483 |
| 5,887,312 A | 3/1999 | Curtin | 15/245.1 |
| 6,047,636 A | 4/2000 | Newman | 101/129 |
| 6,112,656 A | 9/2000 | Asai et al. | 101/123 |
| 6,272,984 B1 | 8/2001 | Kato et al. | 101/129 |

OTHER PUBLICATIONS

Panasonic, "Screen Printer SP20P-MA", Instruction Manual—Maintenance, Section 2—Replacement of Parts, p. 2-2, Published by Create, no date avail.

* cited by examiner

*Primary Examiner*—Jonathan Johnson
(74) *Attorney, Agent, or Firm*—Wade James Brady, III; Frederick J. Telecky, Jr.

(57) ABSTRACT

Apparatus and methods for applying solder paste to circuits, such as integrated circuits, are disclosed. The apparatus and methods comprise a squeegee blade having a pair of elongated face sides spaced apart by a selected thickness and a corresponding pair of elongated substantially parallel narrow sides spaced apart by a selected width. The elongated face sides and elongated narrow sides join together to form squeegee operating edges. The squeegee blade is free of mounting aperture as to provide four operating edges. The squeegee blade is mounted to a resilient clamping structure which applies a regular and controlled gripping force so as to avoid deformation of the squeegee blade edge due to excessive mounting force. The plurality of fasteners are received by the clamping structure for adjusting the gripping force to the squeegee blade.

12 Claims, 4 Drawing Sheets

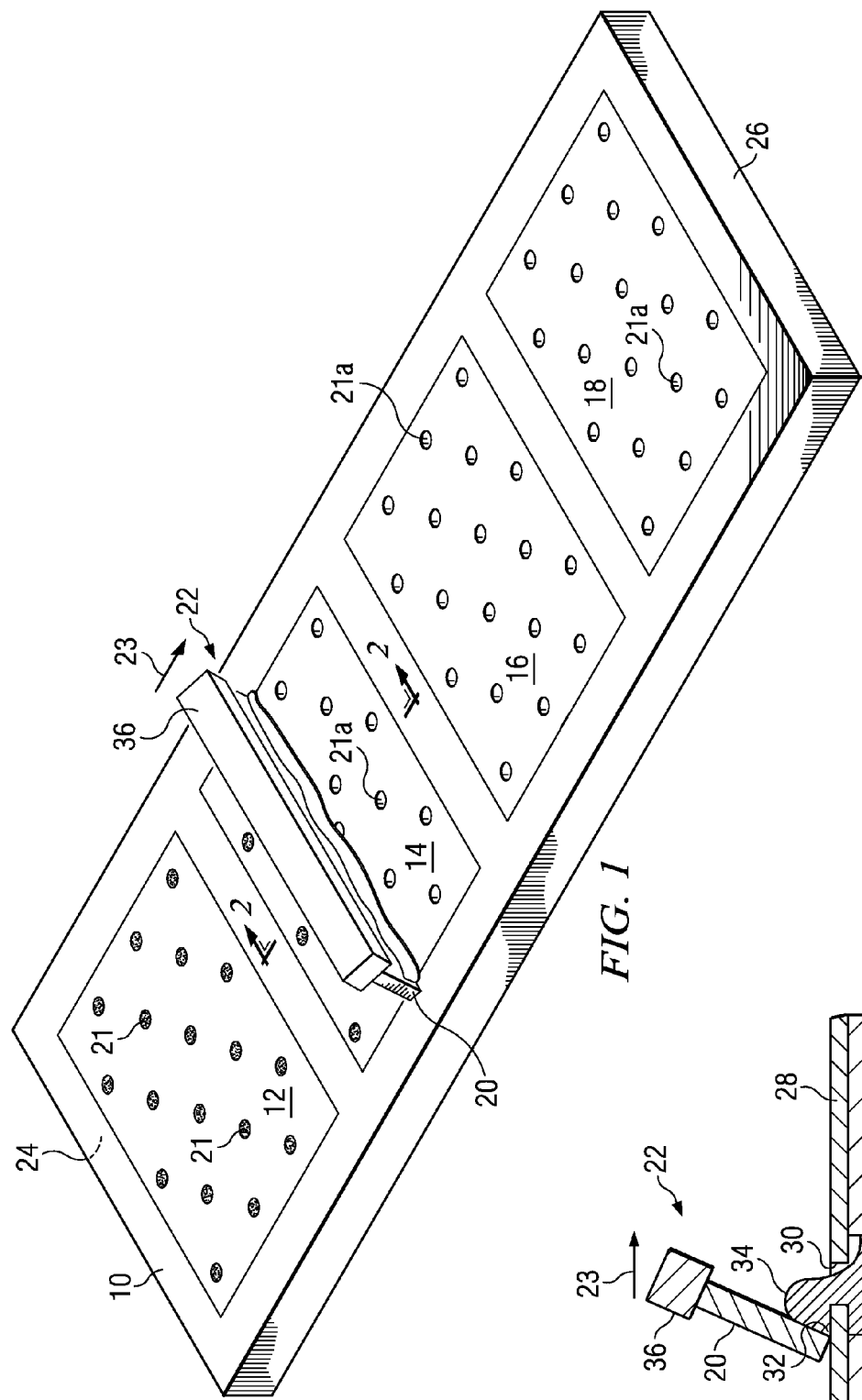
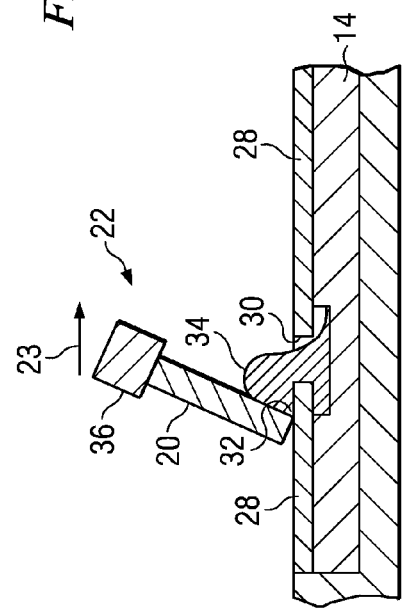

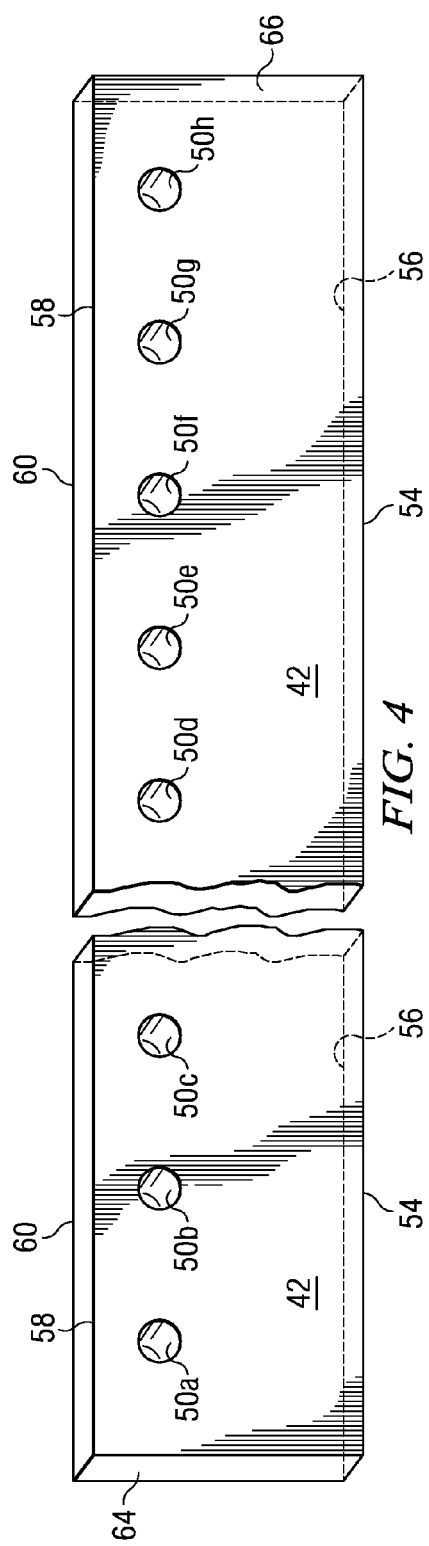
FIG. 4
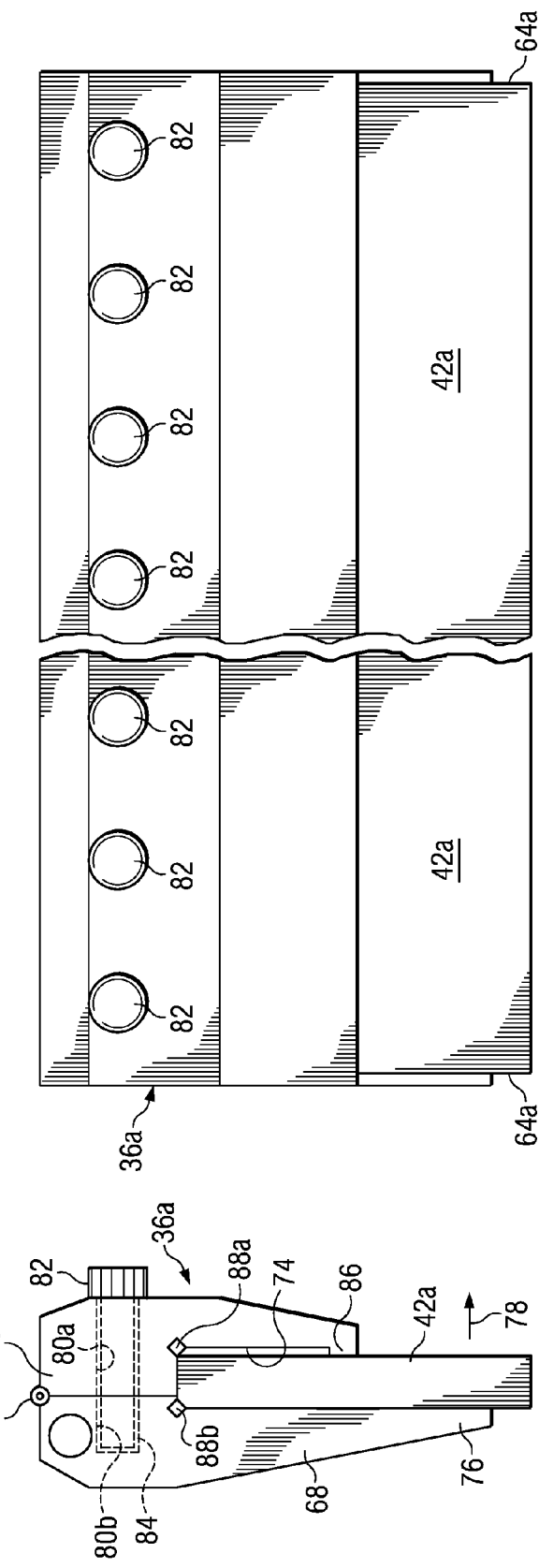
FIG. 5A
FIG. 5B

SCREEN PRINTING SQUEEGEE FOR APPLYING SOLDER PASTE

CROSS REFERENCE TO RELATED APPLICATIONS

This application is a division of prior application Ser. No. 10/243,473, filed Sep. 13, 2002 now abandoned.

FIELD OF THE INVENTION

This invention relates generally to apparatus and methods of manufacturing and using a squeegee apparatus with machinery for applying solder paste to circuit connections, and more specifically, a method and apparatus for mounting the squeegee blade such that all four long edges are available for use instead of the typical two edges. The invention further relates to a method of setting up and aligning the squeegee blade to avoid errors due to deformation caused by clamping forces used to mount the resilient squeegee blade (typically made of rubber).

BACKGROUND OF THE INVENTION

Electrical connections between circuit components and a PCB (printed circuit board) or integrated circuit substrate are typically made by solder ball connections or by dipping the side of a board into molten solder. The PCB in combination with a screen mask or stencil is typically placed connector or back side up such that only related connections are exposed by the stencil or screen mask. The combination PCB and screen mask is placed on a machine such as a MicroStar BGA Solder Ball Attaching Machine. The machine then provides a selected volume of solder paste at one edge of the PCB in front of the squeegee apparatus. The squeegee apparatus is then placed so as to contact the PCB before it is moved across the PCB. As the squeegee moves across the PCB, it evenly distributes solder paste through apertures in the screen mask or stencil to the exposed connection points. Thus, the apertures assure that the selected connections will be coated by solder paste before they receive solder. To assure even distribution of the solder paste, the squeegee blade must be carefully aligned so that the squeegee edge contacting the PCB is parallel to the surface of the PCB. Since a straight and undamaged squeegee edge is necessary to assure the even distribution of the solder paste, the squeegee blade is frequently replaced and/or reoriented such that a new and undamaged edge is available. Further, since the squeegee blade is typically made of a resilient rubber, mounting of the squeegee blade must be accomplished with extreme care to assure that the edge of the squeegee blade that will contact the PCB is parallel to the PCB. In addition, prior art methods of mounting the squeegee blade typically require attaching the blade to holding apparatus by a plurality of bolts. However, the bolts must be carefully torqued or tightened to avoid deforming the rubber due to unequal pressure being applied by the plurality of bolts. Finally, significant amounts of solder paste may be wasted if it is allowed to flow around the ends of the squeegee and beyond the PCB.

SUMMARY OF THE INVENTION

One embodiment of the present invention provides method and apparatus for simplifying the mounting procedures to ensure a properly aligned edge of a squeegee blade and which also doubles the number of edges of the squeegee blade available for use. Another embodiment incorporates over flow end guards to prevent excess solder paste from running around the squeegee ends.

According to the present invention, there is provided methods and apparatus for applying solder paste to circuit connections comprising a squeegee blade having a pair of elongated face sides spaced apart by a selected thickness and a pair of elongated substantially parallel narrow sides spaced apart by a selected width. The elongated face sides and the elongated narrow sides join together at a squeegee operating edge. There is also included a slightly resilient clamping structure defining an elongated rectangular cavity for receiving the squeegee blade. The cavity has a depth less than the selected width of the squeegee blade's first and second longer sides which are separated by a short dimension which is less than the selected thickness of the squeegee blade. Consequently, the clamping structure can apply a gripping force to the squeegee blade when the blade is received within the cavity. Also included is a plurality of fasteners, such as threaded bolts, received by the clamping structure for adjusting the gripping force applied to the squeegee blade to hold the blade firmly into the clamping structure. Unlike the prior art squeegee blades, the squeegee blade of this invention is free of mounting apertures and consequently, each squeegee blade may be oriented such that there are four available edges to provide the squeegee action. Another embodiment of the apparatus further includes solder paste overflow guards which are located at each end of the squeegee blade and perpendicular to the squeegee blade such that solder paste cannot flow beyond the edges of the circuits and be wasted.

BRIEF DESCRIPTION OF THE DRAWINGS

FIG. 1 is a schematic or skeleton illustration of a squeegee apparatus for applying solder paste to circuit connections.

FIG. 2 is a cross-sectional illustration showing a squeegee operation of applying solder paste through a screen mask or template to selected circuit connections.

FIG. 4 is an oblique view of the prior art squeegee blade of FIGS. 3A and 3B.

FIG. 5A is a side view and FIG. 5B is a front view of one embodiment of the squeegee apparatus of the present invention.

DESCRIPTION OF PREFERRED EMBODIMENTS

Figure 3A:
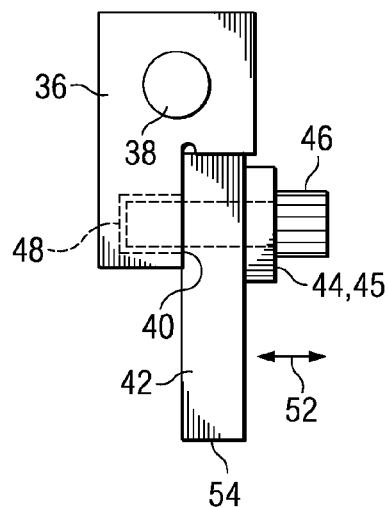
FIG. 3A is a side view and FIG. 3B is a front view of prior art squeegee apparatus.

Referring now to FIG. 1, there is shown a schematic view of an apparatus for applying paste to connections on circuit boards which are to be electrically connected by solder. As shown, the apparatus will include a machine bed 10 for supporting at least one printed circuit board or integrated circuit 12. Squeegee apparatus 20 is supported by holding or support apparatus 22 which moves the squeegee apparatus 20 from a first end 24 of the machine bed 10 to an opposite end 26 of the machine bed. In operation, solder is introduced in front of the squeegee blade and then the squeegee blade is dragged across one or more printed circuit boards or integrated circuits such as integrated circuits 12, 14, 16 and 18 so as to evenly distribute the solder paste across the circuit boards. The solder paste has been applied to PCB 12 as indicated by the solid connections 21. The solder paste has been applied to some of the connections on PCB 14 as indicated by solid connection 21, but not to others as indicated by the empty circuit 21*a*. Solder paste has not been applied to any of the connections on PCBs 16 and 18 as indicated by all of the connections being open as indicated by 21*a*.

Referring now to FIG. 2, there is shown an enlarged schematic of the squeegee blade 20 as it moves across the printed circuit board 14 as indicated by arrow 23. As shown, there is also included a mask screen or stencil 28 which includes apertures, such as aperture 30, which expose areas or connection points on the printed circuit board 14 where solder is to be used for making an electrical connection. As shown, the squeegee edge 32 is dragged or passes over the screen mask or stencil 28 and moves a roll of solder paste 34 across the screen mask 28. In those areas of a circuit board where there are no apertures, such as aperture 30, the squeegee edge 32 of squeegee 20 will typically wipe the screen mask or stencil 28 to clean off the solder paste 34. However, where apertures exist, the solder paste will be forced down into the aperture 30 to provide a coating of the solder paste in those connection areas of the circuit exposed by the stencil 28. Thus, it will be appreciated that the solder paste 34 will only be deposited where a connection is to be made as provided for by the screen mask or stencil. It should also be understood that although there is only a single aperture 30 that has been shown in FIG. 2, there typically will be a plurality (tens or hundreds) of such apertures on a circuit board which receives the solder paste as is better indicated by the connections 21 and 21*a* of FIG. 1.

Figure 3B:
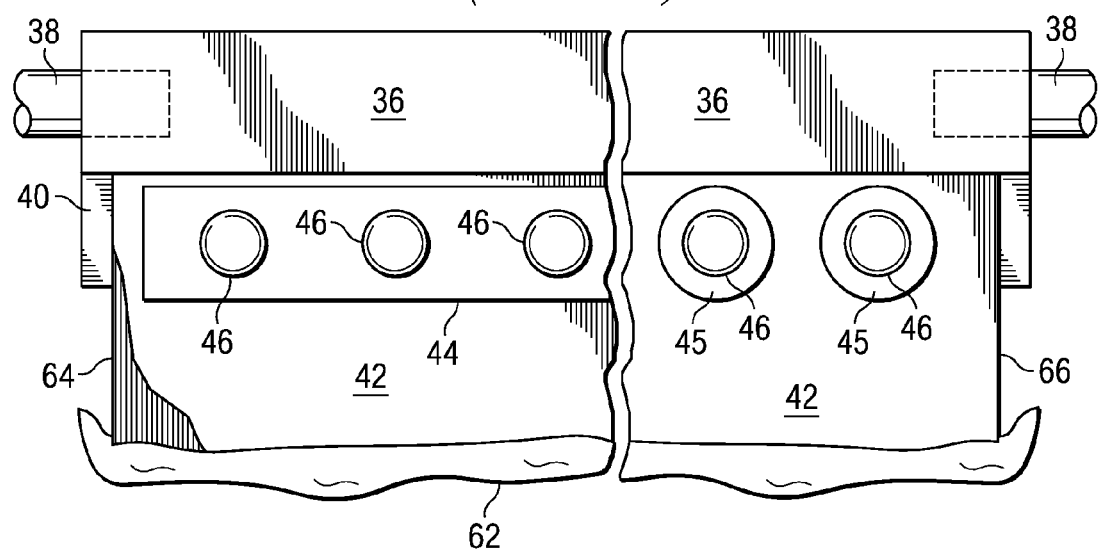

Referring now to FIGS. 3A and 3B, there is shown a side view and a front view, respectively, of a prior art squeegee apparatus. As shown, there is a clamping portion 36 typically mounted to the holding apparatus 22 shown in FIG. 1 by a bolt or mounting rod indicated at reference number 38. The clamping portion 36 typically includes a ledge or cut-out area 40 for receiving a squeegee blade 42 as shown in FIGS. 3A and 3B. A perforated metal strip 44 shown in the left most portion of FIG. 3B or individual washers 45 receive threaded bolts 46 which are received by threaded apertures 48 in the clamping portion 36 as shown in FIG. 3A. FIG. 4 shows a prior art squeegee blade 42, including a series of mounting apertures 50*a* through 50*h*, that allows for the bolts 46 which pass through the perforated strip 44 and for washer 45 to also pass through the apertures 50*a* through 50*h* into the threaded aperture 48 of metal clamping portion 36 of the apparatus. Thus, referring to FIG. 3A, it can be seen that if the combination clamping structure 36 and squeegee blade 42 are moved in the direction as indicated by arrow 52, the edge 54 of squeegee blade 42, which is in the front or forward position, will bear against the screen mask as it moves across the one or more circuit boards and evenly distributes the solder paste. Referring to FIG. 4, it is seen that there are two possible useable edges 54 and 56 for distributing the solder paste. For example, if edge 54 becomes damaged or worn, edge 56 may be used as the contact or front edge by removing squeegee blade 42 from the clamping apparatus 36 and flipping the blade 42 over (180°). The edges 58 and 60 at the top of the solder blade 42 typically are not available for use as squeegee edges because of the mounting apertures 50*a* through 50*h*.

It will also be appreciated by those skilled in the art that the mounting bolts 46 used to clamp squeegee blade 42 to the clamping structure 36 must be carefully tightened or torqued to avoid distortion of the resilient rubber material used in the squeegee blade 42. As will be appreciated by those skilled in the art, if a bolt 46 is tightened an excessive amount, the rubber will deform and may likely cause a protrusion or uneven area at the squeegee edge which contacts the screen mask and thereby makes it impossible to evenly distribute the solder paste. Such an uneven edge may result in such uneven distribution that a gap is formed such that solder paste passes under the blade edge and is not moved across the face of the screen mask.

Finally, it will be appreciated that excessive solder paste indicated at reference numeral 62 in FIG. 3B accumulating in front of the edge 54 of squeegee blade 42, may run around ends 64 and 66 and beyond the edges of the printed circuit boards such that it is not useable and will be wasted.

Referring now to side view FIG. 5A and front view FIG. 5B, there is shown the squeegee apparatus of the present invention. As shown, there is again included a squeegee blade 42A mounted to clamping apparatus 36A. However, as is clear, mounting apparatus and squeegee blades 42A include significant changes and improvements over the prior art apparatus. As shown, clamping apparatus 36A is constructed from a partially resilient material, such as for example, hard rubber, and includes a backing portion 68 and a front or clamping portion 70. Backing portion 68 and clamping portion 70 comprising clamping apparatus 36A are typically two separate pieces or portions, but as shown, could be molded with a thin flexible rubber hinge 72. The backing portion 68 and clamping portion 70 define an elongated rectangular cavity 74 for receiving the squeegee blade 42A. As seen, the backing portion 68 also includes an extension 76 which provides backing support to the more flexible squeegee blade 42A when the squeegee apparatus with blade 42A is moved in the direction as indicated by arrow 78. The front or clamping portion 70 of the clamping apparatus 36A defines a series of apertures 80*a* through which threaded mounting bolts 82 pass and are received in matching apertures 80*b* of backing portion 68 such that a clamping force can be provided to secure the squeegee blade 42A within the cavity 74 discussed above. Threaded inserts 84 may be included within the apertures 80*b* of the backing portion 68 for receiving the threaded bolts 82. Front or clamping portion 70 further typically includes a lip portion 86 which bears against the full length of the squeegee blade 42A to assure sufficient clamping force to maintain the squeegee blade in position. In addition, the partially resilient clamping apparatus allows its mounting bolts to simply be tightened down without having to carefully torque its bolts. Also as shown, the new clamping structure 36A of the present invention further includes expansion spaces 88*a* and 88*b* to relieve distortion of the resilient squeegee blade 42A.

Figure 6:
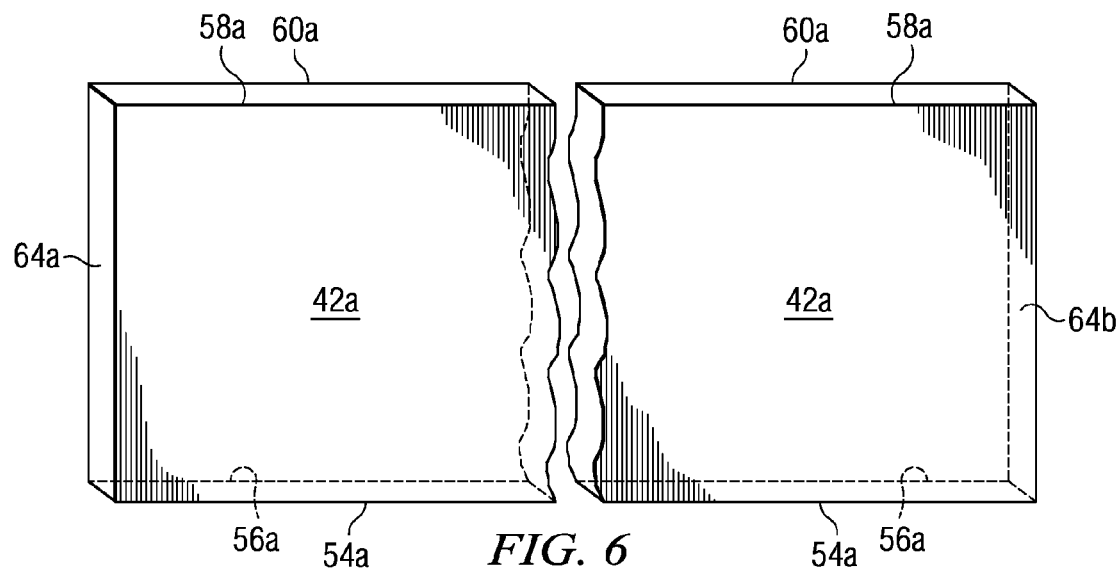
FIG. 6 is an oblique view of the squeegee blade of the squeegee apparatus of the present invention shown in FIGS. 5A and 5B.

Referring now to FIG. 6, there is illustrated the squeegee blade 42A of the present invention. As shown, the squeegee blade 42A of FIG. 6 is free of mounting holes which were necessary for the prior art mounting technique discussed with respect to the squeegee blade shown in FIG. 4. Consequently, in addition to the two edges 54A and 56A shown in FIG. 6, which are available for use for squeegee operation or activity, the present blade may also be rotated such that the squeegee blade edges 58A and 60A are available for use. Thus, it will be appreciated that the present invention allows or provides twice the number of available squeegee blade edges for use in squeegee operations. Further, by using the hard rubber mounting structure 36A, the clamping forces can be more easily controlled and thereby avoid areas of excess pressure which will tend to distort or deform the squeegee edges used to contact the screen mask. Further, the expansion spaces 88a and 88b as illustrated in FIG. 5A allow some expansion of the top edges to further relieve excess pressure and deformation.

Figure 7:
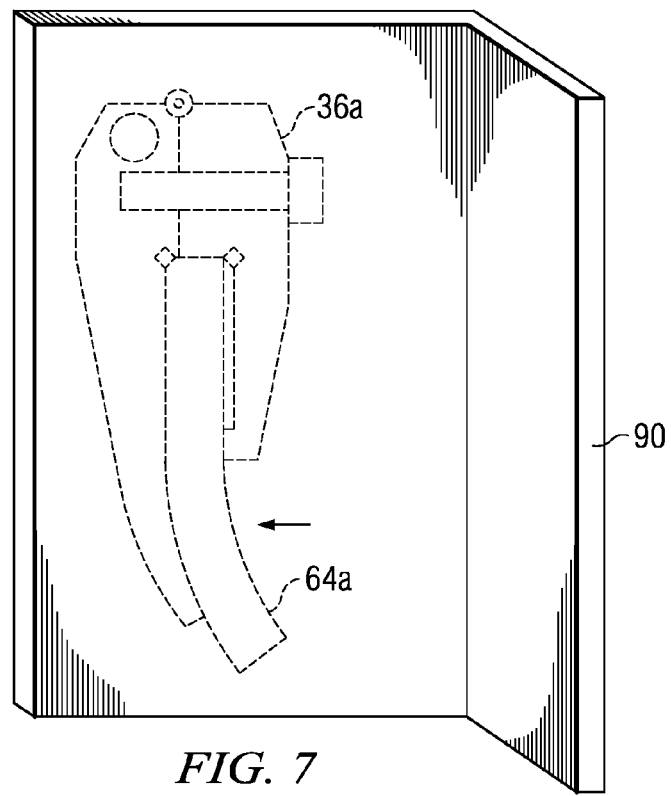
FIG. 7 illustrates another embodiment of the present invention further including side guards to prevent the loss of excess solder.

Referring now to FIG. 7, there is shown a further embodiment of the present invention. As shown, in addition to the improved squeegee blade apparatus 36A as discussed above, the embodiment of FIG. 7 further includes a pair of over flow guard members 90 mounted at each end of the squeegee blade apparatus so as to prevent the excess overflow of solder paste around the ends of the squeegee blade, such as shown at 64A. The over flow guards 90 may be mounted to either the squeegee clamping apparatus 36A or to the holding apparatus 22 shown in FIG. 1 which supports the squeegee apparatus.

Thus, there has been described unique apparatus and methods of this invention for applying solder paste by the use of squeegee blades which methods and apparatus doubles the number of available squeegee edges on a squeegee blade and also helps eliminate distortion or deformation of the squeegee blade to assure a regular undamaged and aligned squeegee blade edge is in contact with a circuit screen mask or stencil. Further, although the invention has been described with respect to specific methods and apparatus, it is not intended that such specific references be considered limitations upon the scope of the invention except as is set forth in the following claims.

The invention claimed is:

1. Squeegee apparatus for applying solder paste to circuits comprising:
   a squeegee blade having a pair of elongated face sides spaced apart by selected thickness and a pair of elongated substantially parallel narrow sides spaced apart by a selected width, said elongated face sides and said elongated narrow sides joined together at squeegee operating edges;
   a slightly resilient clamping structure having a front portion and a backing portion, said front portion and backing portion defining an elongated rectangular cavity for receiving said squeegee blade, said cavity having a depth less than said selected width, first and second long edges, and a short dimension separating said first and second long edges, said short dimension having less than said selected thickness such that said clamping structure applies a gripping force to said squeegee blade when received by said cavity; and
   a plurality of fasteners received by said claming structure for increasing said gripping force applied to said squeegee blade;
   said clamping structure defining said cavity for receiving said squeegee blade further defining relief spaces disposed therein to accommodate expansive distortion of said squeegee blade into said relief spaces when secured by said clamping structure; wherein said relief spaces are disposed at a pair of opposing corners of said squeegee blade.

2. The squeegee apparatus of claim 1, wherein said backing portion includes an extension beyond and along said first long edge of said substantially rectangular cavity to reduce flexing of said squeegee blade resulting from a force applied perpendicular to one of said elongated face sides.

3. The squeegee apparatus of claim 2, wherein said second long edge of said cavity defines a lip for gripping said squeegee blade.

4. The squeegee apparatus of claim 1, wherein said clamping structure is made for hard rubber.

5. The squeegee apparatus of claim 1, wherein said fasteners are threaded bolts.

6. The squeegee apparatus of claim 5, wherein said clamping structure further comprises embedded threaded insert embedded in said backing portion for receiving said threaded bolts.

7. The squeegee apparatus of claim 1, wherein said squeegee blade is free of mounting apertures.

8. The squeegee apparatus of claim 1, wherein said squeegee blade is a parallel parallelepiped with four long edges and wherein all four edges may be used as operating squeegee edges.

9. The squeegee apparatus of claim 1, wherein said squeegee blade is made of rubber.

10. The squeegee apparatus of claim 1, wherein said squeegee apparatus further includes solder paste overflow guards located perpendicular to each of said ends of said squeegee blade.

11. The squeegee apparatus of claim 1, wherein said relief spaces extend along the entire length of said squeegee blade.

12. The squeegee apparatus of claim 1, wherein said relief spaces extend along the entire length of said squeegee blade.

* * * * *